US011710672B2

(12) United States Patent
Gaines et al.

(10) Patent No.: US 11,710,672 B2
(45) Date of Patent: Jul. 25, 2023

(54) MICROELECTRONIC PACKAGE WITH UNDERFILLED SEALANT

(71) Applicant: Intel Corporation, Santa Clara, CA (US)

(72) Inventors: Taylor William Gaines, Chandler, AZ (US); Ken Hackenberg, Plano, TX (US); Frederick W. Atadana, Chandler, AZ (US); Elah Bozorg-Grayeli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 16/504,734

(22) Filed: Jul. 8, 2019

(65) Prior Publication Data

US 2021/0013115 A1    Jan. 14, 2021

(51) Int. Cl.
| H01L 23/10 | (2006.01) |
| H01L 23/367 | (2006.01) |
| H01L 23/373 | (2006.01) |
| H01L 21/50 | (2006.01) |
| H01L 21/56 | (2006.01) |
| H01L 23/42 | (2006.01) |

(52) U.S. Cl.
CPC ............. *H01L 23/10* (2013.01); *H01L 21/50* (2013.01); *H01L 21/563* (2013.01); *H01L 23/367* (2013.01); *H01L 23/3736* (2013.01); *H01L 23/42* (2013.01); *H01L 2924/16152* (2013.01)

(58) Field of Classification Search
CPC . H01L 2224/80024; H01L 2224/80011; H01L 2224/80091; H01L 2224/7501; H01L 2021/60052; H01L 23/10; H01L 23/34; H01L 23/36–3738; H01L 21/56–568; H01L 2924/16152
See application file for complete search history.

(56) References Cited

U.S. PATENT DOCUMENTS

| 5,090,651 A | * | 2/1992 | Mittag | .................... B23K 1/008 |
| | | | | 432/64 |
| 5,227,604 A | * | 7/1993 | Freedman | ............ B23K 1/0056 |
| | | | | 219/121.84 |

(Continued)

FOREIGN PATENT DOCUMENTS

| CN | 202817020 U | * | 3/2013 | ............ H01L 23/367 |
| WO | WO-2004090938 A2 | * | 10/2004 | ............. H01L 23/10 |
| WO | WO-2019066992 A1 | * | 4/2019 | ......... H01L 21/4882 |

OTHER PUBLICATIONS

Machine translation, Shimokawa, Chinese Pat. Pub. No. CN-202817020-U, translation date: Sep. 20, 2022, Clarivate Analytics, all pages. (Year: 2022).*

*Primary Examiner* — Victoria K. Hall
(74) *Attorney, Agent, or Firm* — Akona IP

(57) ABSTRACT

Embodiments may relate to a method of forming a microelectronic package with an integrated heat spreader (IHS). The method may include placing a solder thermal interface material (STIM) layer on a face of a die that is coupled with a package substrate; coupling the IHS with the STIM layer and the package substrate such that the STIM is between the IHS and the die; performing formic acid fluxing of the IHS, STIM layer, and die; and dispensing, subsequent to the formic acid fluxing, sealant on the package substrate around a periphery of the IHS.

20 Claims, 10 Drawing Sheets

(56) References Cited

U.S. PATENT DOCUMENTS

| Patent/Pub No. | Kind | Date | Inventor | Classification |
|---|---|---|---|---|
| 5,514,414 A * | | 5/1996 | Gao | H05K 3/3489 118/724 |
| 5,898,224 A * | | 4/1999 | Akram | H01L 23/552 257/E21.511 |
| 6,545,869 B2 * | | 4/2003 | Bonitz | H01L 21/4882 361/705 |
| 6,747,350 B1 * | | 6/2004 | Lin | H01L 23/552 257/E23.114 |
| 6,909,176 B1 * | | 6/2005 | Wang | H01L 23/055 257/E23.101 |
| 6,949,404 B1 * | | 9/2005 | Fritz | H01L 23/3675 438/106 |
| 6,984,286 B2 * | | 1/2006 | Bonitz | H01L 23/3735 257/E23.092 |
| 7,081,672 B1 * | | 7/2006 | Govind | H01L 23/50 257/E23.079 |
| 7,535,099 B2 * | | 5/2009 | Suh | H01L 23/3736 257/713 |
| 7,585,702 B1 * | | 9/2009 | Wang | H01L 23/3128 257/706 |
| 7,781,682 B2 * | | 8/2010 | Bahadur | H01L 21/56 257/713 |
| 8,174,113 B2 * | | 5/2012 | Gupta | H01L 23/42 257/E23.101 |
| 8,211,501 B2 * | | 7/2012 | Simion | H01L 23/3675 427/255.39 |
| 8,550,327 B2 * | | 10/2013 | Deppisch | B23K 35/3013 228/56.3 |
| 9,142,480 B2 * | | 9/2015 | Houle | H01L 23/24 |
| 2002/0052105 A1 * | | 5/2002 | Akram | H01L 21/563 257/E23.092 |
| 2002/0141160 A1 * | | 10/2002 | Bonitz | H01L 21/563 361/705 |
| 2003/0101582 A1 * | | 6/2003 | Bonitz | H01L 23/3735 257/E23.092 |
| 2004/0155329 A1 * | | 8/2004 | Sur | H01L 23/42 257/E23.09 |
| 2004/0155338 A1 * | | 8/2004 | Shim | H01L 23/10 257/E23.101 |
| 2004/0188831 A1 * | | 9/2004 | Hsiao | H01L 23/10 257/E23.101 |
| 2004/0262766 A1 * | | 12/2004 | Houle | H01L 23/04 257/E23.087 |
| 2005/0211752 A1 * | | 9/2005 | Hurley | B23K 31/02 228/221 |
| 2005/0224953 A1 * | | 10/2005 | Lee | H01L 23/24 438/125 |
| 2005/0284863 A1 * | | 12/2005 | DeBonis | H05B 6/105 219/635 |
| 2006/0063300 A1 * | | 3/2006 | Yuan | H01L 22/20 257/E23.125 |
| 2006/0091509 A1 * | | 5/2006 | Zhao | H01L 23/552 257/E23.101 |
| 2006/0091542 A1 * | | 5/2006 | Zhao | H01L 23/36 257/E23.101 |
| 2006/0138643 A1 * | | 6/2006 | Lu | H01L 23/3128 257/E23.092 |
| 2006/0278986 A1 * | | 12/2006 | Trezza | H01L 23/481 257/E21.705 |
| 2007/0164424 A1 * | | 7/2007 | Dean | H01L 23/4275 257/E23.087 |
| 2007/0222472 A1 * | | 9/2007 | Raravikar | G01R 31/2896 73/774 |
| 2008/0017975 A1 * | | 1/2008 | Deppisch | H01L 23/42 257/E21.503 |
| 2008/0073776 A1 * | | 3/2008 | Suh | H01L 23/3736 257/706 |
| 2008/0090405 A1 * | | 4/2008 | Fitzgerald | B23K 35/286 438/612 |
| 2008/0251944 A1 * | | 10/2008 | Oi | H01L 21/6835 257/E23.061 |
| 2009/0197370 A1 * | | 8/2009 | Katsura | H01L 21/563 257/E21.511 |
| 2009/0231820 A1 * | | 9/2009 | Tanaka | H05K 1/162 361/321.1 |
| 2009/0294515 A1 * | | 12/2009 | Prack | B23K 1/20 228/101 |
| 2009/0321923 A1 * | | 12/2009 | Swaminathan | H01L 23/10 438/122 |
| 2010/0013089 A1 * | | 1/2010 | So | H01L 23/3675 438/122 |
| 2010/0039777 A1 * | | 2/2010 | Houle | H01L 23/24 438/122 |
| 2010/0065246 A1 * | | 3/2010 | Gupta | B23K 1/0016 228/208 |
| 2011/0092026 A1 * | | 4/2011 | Simion | H01L 23/3675 438/122 |
| 2011/0127663 A1 * | | 6/2011 | Swaminathan | H01L 21/563 257/690 |
| 2011/0129963 A1 * | | 6/2011 | Kostiew | H01L 21/50 438/118 |
| 2012/0217287 A1 * | | 8/2012 | Kumar | B23K 1/0016 228/232 |
| 2013/0026660 A1 * | | 1/2013 | Czubarow | H01L 24/29 257/E23.116 |
| 2013/0043015 A1 * | | 2/2013 | Straznicky | H01L 23/42 165/185 |
| 2013/0285233 A1 * | | 10/2013 | Bao | H01L 23/427 257/E23.101 |
| 2014/0061893 A1 * | | 3/2014 | Saeidi | H01L 23/562 438/122 |
| 2014/0091461 A1 * | | 4/2014 | Shen | H01L 23/24 257/737 |
| 2014/0193658 A1 * | | 7/2014 | Ross | H01L 24/27 228/179.1 |
| 2014/0368992 A1 * | | 12/2014 | Strader | H01L 23/3675 156/60 |
| 2016/0120039 A1 * | | 4/2016 | Bang | H05K 3/341 156/60 |
| 2016/0225742 A1 * | | 8/2016 | Davis | H01L 29/0657 |
| 2016/0252688 A1 * | | 9/2016 | Barwicz | G02B 6/1225 385/14 |
| 2016/0315030 A1 * | | 10/2016 | Strader | H01L 23/42 |
| 2017/0033038 A1 * | | 2/2017 | Nakagawa | H01L 25/00 |
| 2017/0053850 A1 * | | 2/2017 | Watanabe | H01L 23/3675 |
| 2017/0186667 A1 * | | 6/2017 | Choudhury | G06F 1/20 |
| 2018/0009072 A1 * | | 1/2018 | Kittel | B23P 15/26 |
| 2018/0358298 A1 * | | 12/2018 | Zhai | H01L 23/16 |
| 2019/0329367 A1 * | | 10/2019 | Tsai | H01L 21/4882 |
| 2019/0348340 A1 * | | 11/2019 | Kwon | H01L 23/3675 |
| 2020/0111773 A1 * | | 4/2020 | Kumar | H01L 25/18 |
| 2020/0161230 A1 * | | 5/2020 | Knickerbocker | H01L 25/0652 |
| 2020/0373220 A1 * | | 11/2020 | Chan Arguedas | H01L 23/5385 |
| 2020/0402886 A1 * | | 12/2020 | Kobune | H01L 23/42 |
| 2020/0411407 A1 * | | 12/2020 | Dubey | H01L 25/0652 |
| 2021/0013123 A1 * | | 1/2021 | Gaines | H01L 23/3675 |
| 2021/0020537 A1 * | | 1/2021 | Chan Arguedas | H01L 24/29 |
| 2021/0028084 A1 * | | 1/2021 | Chan Arguedas | H01L 23/3675 |
| 2021/0039206 A1 * | | 2/2021 | Cai | B23K 35/0238 |
| 2021/0183733 A1 * | | 6/2021 | Kobune | H01L 23/3737 |
| 2022/0051966 A1 * | | 2/2022 | Sturcken | H01L 23/49568 |

* cited by examiner

MICROELECTRONIC PACKAGE WITH UNDERFILLED SEALANT

BACKGROUND

Some microelectronic packages may use a solder thermal interface material (STIM) as the interface between a die and an integrated heat spreader (IHS). In some embodiments, the IHS may be coupled with a package substrate, and a sealant may be used to assist with the formation of the joint between the IHS and the package substrate. However, use of the STIM may require use of a soldering flux which may negatively interact with the sealant. Specifically, the sealant may outgas onto the solder interface, the soldering flux may contaminate the sealant, or the sealant may become less adhesive due to interaction with the soldering flux.

DETAILED DESCRIPTION

Figure 1:
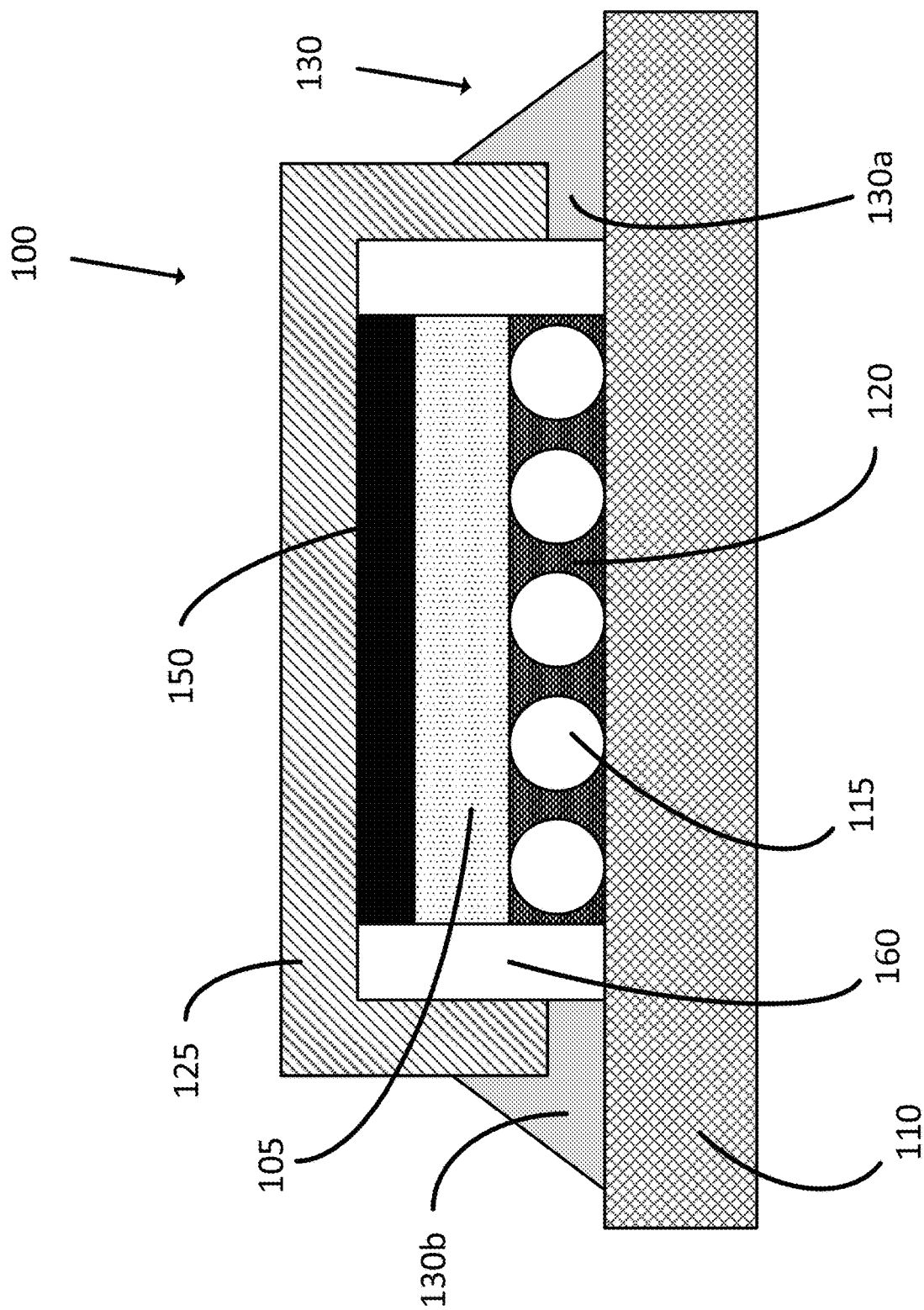
FIG. 1 depicts an example microelectronic package with an underfilled sealant, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, the use of a soldering flux to prepare the STIM layer of a microelectronic package may have negative interactions with a sealant of the microelectronic package. Specifically, the sealant may outgas onto the solder interface, the soldering flux may contaminate the sealant, or the sealant may become less adhesive due to interaction with the soldering flux.

More generally, next-generation microelectronic packages may create a desire for more effective thermal solutions based on increased power delivery or increased performance of dies of the microelectronic packages. However, the force of placement and bonding of the IHSs may squeeze soldering flux out of the microelectronic package into pre-designated keep-out zones (KOZs). Dispensation of the soldering flux may also lead to KOZ violation if the soldering flux-dispensation process is not well-controlled.

As an alternative to use of a liquid soldering flux, formic acid vapor fluxing may be desirable. However, formic acid vapor fluxing may require use of a gas that includes the formic acid, and therefore a key challenge in implementing formic acid reflow with a microelectronic package that includes a STIM is sealant outgassing onto solder interface surfaces. Additionally, the formic acid may interact with the sealant.

In embodiments herein, a STIM reflow process may be performed with no sealant between the IHS and the package substrate. The bond line thickness (BLT) of the STIM may be set without the sealant being present. Subsequently to STIM reflow, the sealant may be applied. By performing the STIM reflow prior to application of the sealant, the technique may decouple soldering flux materials and their required processes from the sealant materials and their required processes. The de-flux washing process may also be used to remove soldering flux residue prior to application of the sealant. This technique may also enable formic acid fluxing, which would otherwise interact with the sealant if the sealant was applied prior to application of the fluxing. A low-viscosity sealant may then be applied to the microelectronic package, and the sealant may flow between the IHS and the package substrate through a capillary-underfill (CUF) type process.

Embodiments herein may provide several advantages. Specifically, embodiments may enable the use of water-soluble soldering flux, and soldering flux removal, without contaminating the sealant. Additionally, the use of formic acid soldering flux, which may be more efficient than the water-soluble soldering flux, may be enabled. Finally, adhesion of the sealant may be increased based on a variety of factors that may include: 1) better wetting of the IHS than legacy techniques; 2) an increased surface area of the sealant; and 3) a mechanically-robust fillet formation.

FIG. 1 depicts an example microelectronic package 100 with an underfilled sealant, in accordance with various embodiments. The microelectronic package 100 may include a die 105. The die 105 may be or include, for example, a processor such as a central processing unit (CPU), graphics processing unit (GPU), a core of a distributed processor, or some other type of processor. Alternatively, the die 105 may be include a memory such as a double data rate (DDR) memory, a non-volatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The die 105 may be coupled with a package substrate 110. The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate. It will be understood that although the package substrate 110 is discussed herein as an element of the microelectronic package 100, in other embodiments the package substrate 110 may be considered to be an element separate from the microelectronic package 100 to which the microelectronic package 100 is coupled. For the sake of ease of description herein, the package substrate 110 will generally be discussed as an element of the microelectronic package 100 without taking a specific position on this possible difference in naming convention.

Generally, the die 105 may be coupled with the package substrate 110 by one or more interconnects 115. The interconnects 115 may be, for example, solder bumps that are formed of a material such as tin, silver, copper, etc. If solder bumps are used for the interconnects 115, then the solder bumps may be elements of a ball grid array (BGA) as shown in FIG. 1. In other embodiments, the interconnects 115 may be pins of a pin grid array (PGA), elements of a land grid array (LGA), or some other type of interconnect. Generally, the interconnects 115 may physically or communicatively couple the die 105 with the package substrate 110. For example, the interconnects 115 may physically couple with, and allow electrical signals to pass between, pads of the die 105 and pads of the package substrate 110 (not shown for the sake of elimination of clutter of FIG. 1).

The microelectronic package may further include an underfill material 120. The underfill material 120 may at least partially surround the interconnects 115, and may at least partially fill the space between the die 105 and the package substrate 110. Generally, the underfill material 120 may lend further structural stability to the microelectronic package 100 and strengthen the connection between the die 105 and the package substrate 110. The underfill material 120 may be formed of a polymer material such as epoxy or some other material.

The microelectronic package 100 may further include a STIM layer 150. The STIM layer 150 may be formed of a solder material such as indium or some other material. Generally, the STIM layer 150 may be considered to be a thermally conductive material. The STIM layer 150 may couple with an IHS 125. The IHS 125 may be formed of a thermally conductive material such as copper or some other material. The IHS 125 may couple with a thermal solution such as a vapor chamber, a water-cooled cooling apparatus, fins, or some other type of thermal solution. The thermal solution is not depicted in FIG. 1 for the sake of reduction of clutter of the Figure. In operation, the STIM layer 150 may serve to draw thermal energy from the die 105. The thermal energy may be generated through operation of the die 105 and, if the die 105 is a high-performance die, then the die 105 may generate a significant amount of thermal energy. The thermal energy may travel from the STIM layer 150 to the IHS 125 where the thermal energy may then be dispersed through the IHS 125. The IHS 125 may transfer the thermal energy to the thermal solution where the thermal energy may be dispersed away from the microelectronic package 100. As noted above, and as will be explained in greater detail below, the application of the STIM 150 may require use of a soldering flux such as a liquid based soldering flux or a formic acid soldering flux.

In embodiments, the IHS 125 may be coupled with the package substrate 110. Specifically, the IHS may be coupled with the package substrate 110 by a sealant 130. The sealant 130 may be applied to the microelectronic package 100 subsequent to the application of the STIM layer 150 and the attachment of the IHS 125 to the microelectronic package 100. More specifically, the sealant 130 may be formed of a low-viscosity material that is applied around the periphery of the IHS 125. The sealant 130 may flow into gaps between the IHS 125 and the package substrate 110 as shown. As a result, the sealant 130 may include two parts. The first part 130a of the sealant 130 may be between the package substrate 110 and the IHS 125. The second part 130b of the sealant 130 may be external to the footprint of the IHS 125 along the surface of the package substrate 110. As used herein, the term "footprint" of the IHS 125 may refer to the space below the IHS 125 as oriented in FIG. 1. It will be understood that the first part 130a and the second part 130b are described herein as logical separations of the sealant 130 for the purpose of description herein, and in embodiments the sealant 130 may be a unitary element of or on the microelectronic package 100.

As can be seen in FIG. 1, the second part 130b of the sealant 130 may extend at least partially along the side of the IHS 125 to form a fillet. This extension of the sealant 130 along the side of the IHS 125 may be because the sealant 130 may be dispensed along the periphery of the IHS 125, and then the sealant 130 may flow between the IHS 125 and the package substrate 110 through a CUF-type process to form the first part 130a of the sealant 130. As a result, in embodiments the sealant 130 may be referred to as an "underfilled" sealant. Generally, the sealant may be dispensed through a type of injected nozzle such as a time-pressure nozzle, an augur nozzle, a jet nozzle, or some other type of dispensation technique.

The sealant 130 may be formed of a relatively low-viscosity type of epoxy, silicon, etc. More generally, the sealant 130 may be an adhesive material that can be made to flow via capillary action. Specific rheological and thermomechanical properties of the sealant 130 may be based on factors such as the use case to which the microelectronic package 100 will be put, the materials used in the microelectronic package 100 (e.g., the material of the IHS 125), the specific thermal properties of the die 105, etc. In some embodiments, the sealant 130 may have a modulus range between approximately 3 and approximately 50 megapascals (MPas). The sealant 130 may additionally or alternatively have a sub-zero glass transition temperature. In some embodiments, the sealant 130 may react with the material of the IHS 125 to increase adhesion or reliability of the sealant 130. In some embodiments, the sealant 130 may include additional elements to increase adhesion or reliability such as fillers, modifiers, adhesion promoters, etc. As an example, the sealant 130 may include fillers such as silica, silicone, alumina, some other metal filler, some other organic filler, etc. The sealant 130 may additionally or alternatively include adhesion promoters such as silanes, titanates, zirconates, etc.

Figure 2:
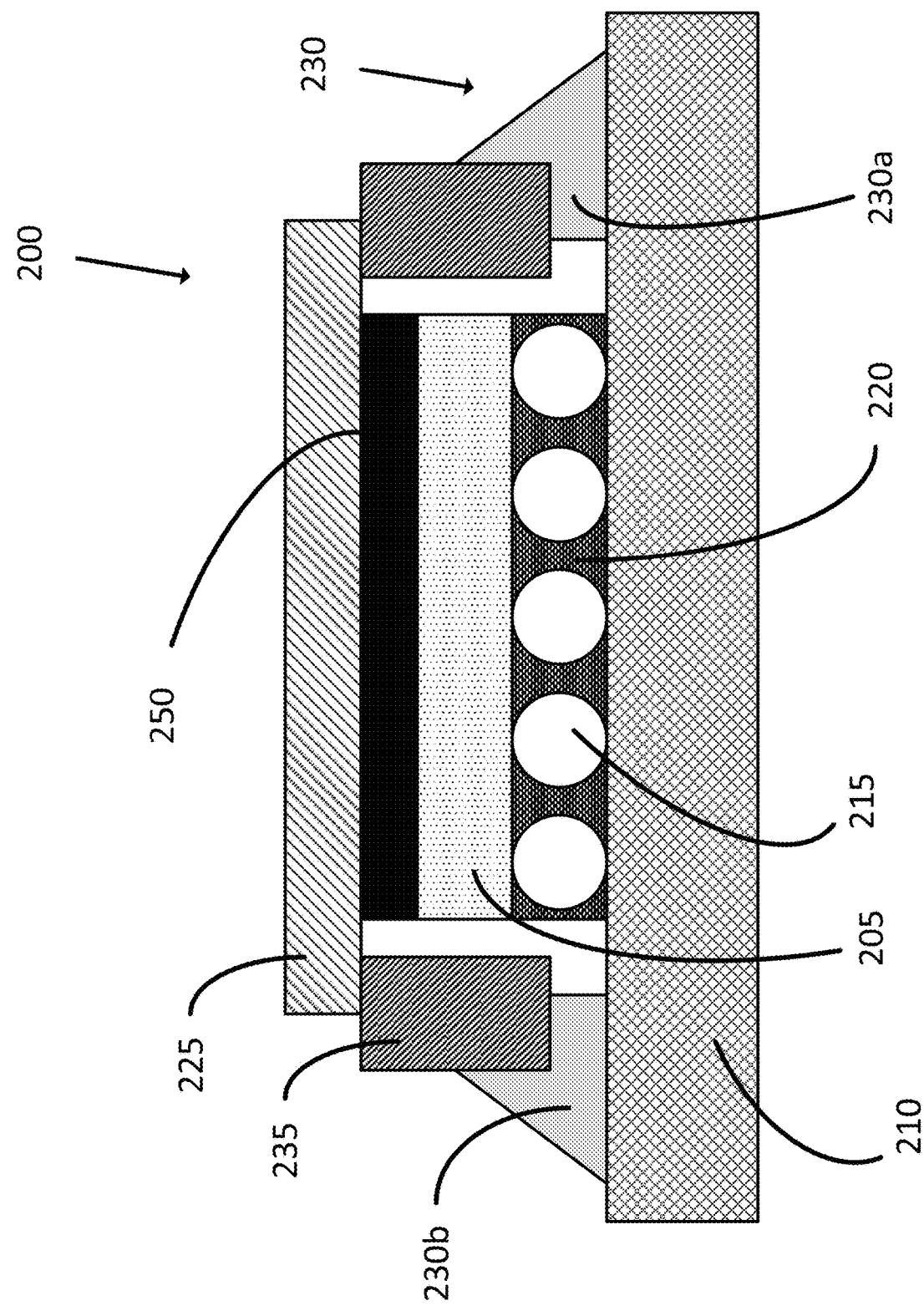
FIG. 2 depicts an alternative example microelectronic package with an underfilled sealant, in accordance with various embodiments.

FIG. 2 depicts an alternative example microelectronic package 200 with an underfilled sealant, in accordance with various embodiments. Generally, the microelectronic package 200 may include elements that are similar to those of microelectronic package 100. Specifically, the microelectronic package 200 may include a die 205, a package substrate 210, interconnects 215, underfill 220, STIM layer 250, and sealant 230 with a first part 230a and a second part 230b, which may be respectively similar to, and share one or more characteristics with, die 105, package substrate 110, interconnects 115, underfill 120, STIM layer 150, and sealant 130.

The microelectronic package 200 may further include an IHS 225, which may be generally similar to IHS 125. Specifically, the IHS 225 may be formed of a thermally conductive material such as copper or some other material, and may effectuate heat transfer from the die 205 (or, more precisely, from the die 205 through the STIM layer 250) to a thermal solution as described above. As may be seen in FIG. 2, however, the IHS 225 may not have "leg" type portions that extend vertically from the IHS and couple with the package substrate 210 (in contrast, FIG. 1 illustrates that the IHS 125 has "leg" type portions extending vertically from the IHS 125 towards the package substrate 110 and separated from the die 105 by gaps 160). Rather, the IHS 225 may include one or more spacers 235. In some embodiments the spacers 235 may be formed of a same material as the IHS 225. In other embodiments the spacers 235 may be formed of a different material than the IHS 225 such as a metallic material, a plastic material, etc. In some embodiments the spacers 235 may be a single element that generally surrounds the die 205 in a direction generally parallel to the face of the package substrate 210 to which the die 205 is coupled, while in other embodiments the IHS 225 may include a plurality of spacers located at different portions of the microelectronic package 200 around the die 205. In some embodiments the spacers 235 may serve to space the IHS 225 away from the package substrate 210, while in other embodiments the spacers 235 may serve to stiffen the microelectronic package 200 by providing additional reinforcement at the periphery of the IHS 225.

In the embodiment of FIG. 2, the second portion 230b of the sealant 230 may extend at least partially along the wall of the spacer 235. Specifically, the sealant 230 may be placed at the periphery of the microelectronic package 200 adjacent to the spacers, and the first portion 230a of the sealant 230 may be formed between the spacer and the package substrate 210, while the second portion 230b generates the fillet of sealant material as depicted.

Figure 3:
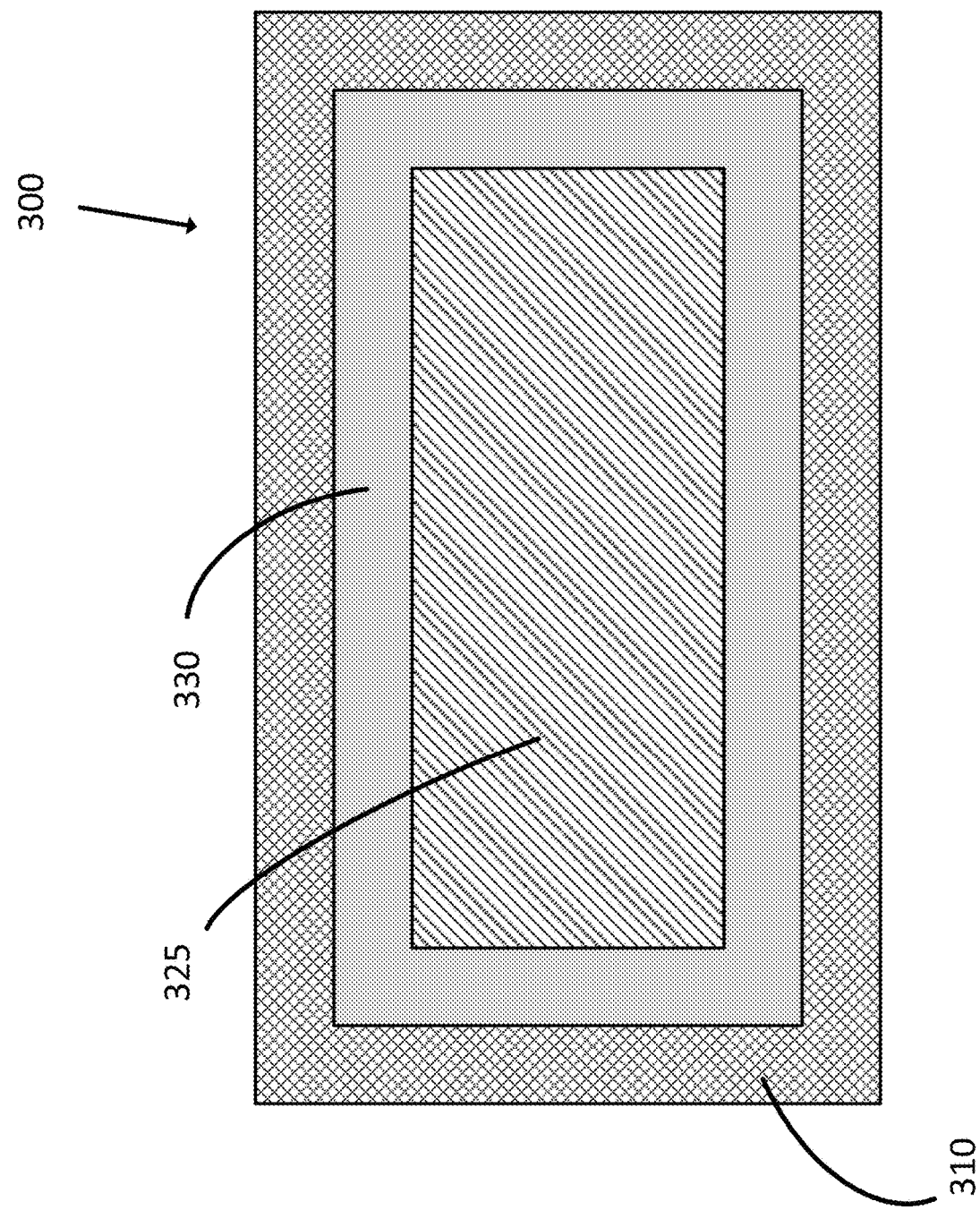
FIG. 3 depicts a top-down view of an example microelectronic package with an underfilled sealant, in accordance with various embodiments.

FIG. 3 depicts a top-down view of an example microelectronic package 300 with an underfilled sealant, in accordance with various embodiments. Specifically, the microelectronic package 300 may include a package substrate 310 with an IHS 325, which may be respectively similar to, and share one or more characteristics of, package substrate 110 and IHS 125. As can be seen, the microelectronic package 300 may further include a fillet of sealant 330, which may be similar to, and share one or more characteristics of, sealant 130. Specifically, the sealant 330 may be generally similar to the second portion 130b of sealant 130. As can be seen, the sealant 330 may generally extend from the footprint of the IHS 325 along the package substrate 310.

It will be understood that FIGS. 1-3 are intended as examples of various embodiments of an underfilled sealant, and other embodiments may have one or more variations. For example, various embodiments may have more or fewer elements than depicted, or additional elements (e.g., interconnects 115/215, additional elements such as passive or active components which may not be depicted, etc.) Some elements such as the IHSs 125/225/325, the dies 105/205, the package substrates 110/210/310, etc. may have a different shape than depicted. In some embodiments, elements of the microelectronic packages 100/200/300 may have dimensions different than those depicted. For example, certain elements may be taller/shorter/longer/wider/narrower/etc. than depicted. Some elements may have different dimensions relative to other elements. Generally, the elements of the various Figures are depicted for the sake of ease of discussion of characteristics of the elements, and so the relative dimensions of various elements are not to be taken as limiting of alternative embodiments unless explicitly stated otherwise.

Figure 4:
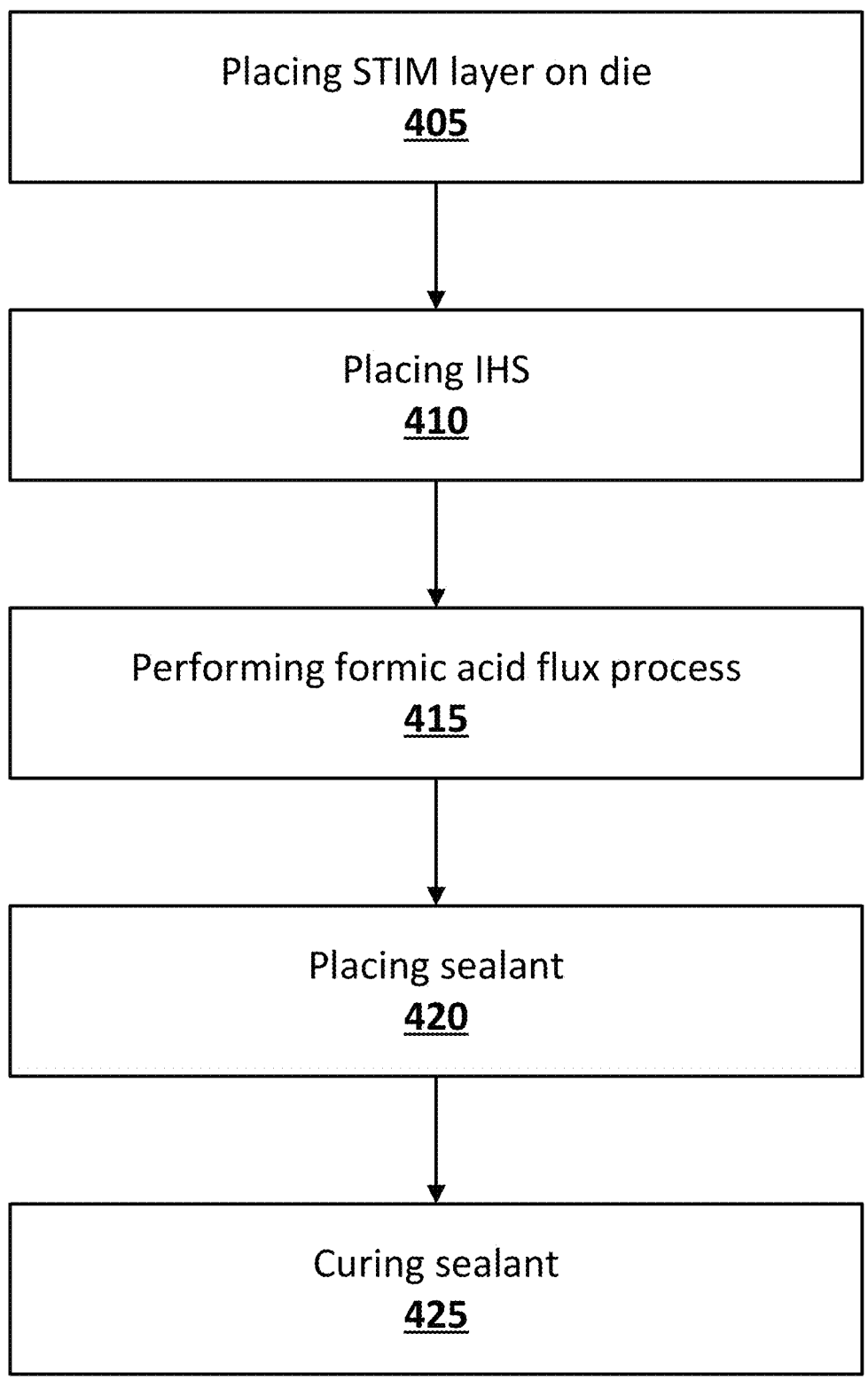
FIG. 4 depicts an example technique for manufacturing a microelectronic package with an underfilled sealant, in accordance with various embodiments.

FIG. 4 depicts an example technique for manufacturing a microelectronic package with an underfilled sealant, in accordance with various embodiments. Specifically, FIG. 4 may depict a technique which may be used with a formic acid soldering flux, as described above. Generally, embodiments of this technique (and other techniques as described with respect to FIGS. 5-7) may be described with respect to elements of FIG. 1, however it will be understood that the described technique(s) may be applicable, with or without modification, in whole or in part, to other embodiments of the present disclosure.

Generally, the technique may include placing, at 405, a STIM layer on a die. The STIM layer may be similar to, and share one or more characteristics of, STIM layer 150. The die may be similar to, and share one or more characteristics of, die 105. Generally, the STIM layer may be placed on the die through a deposition technique such as pick- and place or some other type of placement technique.

The technique may further include placing, at 410, an IHS on the microelectronic package. The IHS may be similar to, and share one or more characteristics of, IHS 125. Placing the IHS on the microelectronic package may include thermally or physically coupling the IHS to the STIM layer. Placing the IHS on the microelectronic package may also include coupling the IHS to the package substrate of the microelectronic package. In some embodiments the IHS material may be coupled with the package substrate while in other embodiments the IHS may include a spacer or stiffener that is coupled with the package substrate.

The technique may further include performing, at 415 a formic acid soldering flux process. Generally, the formic acid soldering flux process may include placing the microelectronic package in an oven that is then flooded with a gas that includes formic acid. The formic acid may interact with one or more of the STIM layer, the die, or the IHS to remove oxides from the surfaces of the die or IHS. The removal of the oxides from the surfaces of the die or the IHS may increase the adhesion of, and thereby strengthen, the STIM-die or STIM-IHS bond.

After the formic acid soldering flux process has been performed at 415, the microelectronic package may be removed from the formic acid oven. The technique may then include placing the sealant at 420. The sealant may be similar to, and share one or more characteristics of, sealant 130. Placing the sealant may include, for example, dispensing the sealant around the periphery of the IHS as discussed with respect to FIG. 1. As discussed, the sealant may then flow between the IHS and the package substrate through a CUF-type process.

The technique may then include curing, at 425, the sealant material. The sealant material may be cured through application of heat, chemical curing, etc. In this manner, a microelectronic package such as microelectronic package 100 may be formed. In some embodiments the STIM reflow and the sealant cure may be performed generally simultaneously with one another, as shown, while in other embodiments the STIM reflow and sealant cure may be performed separately from one another.

Figure 5:
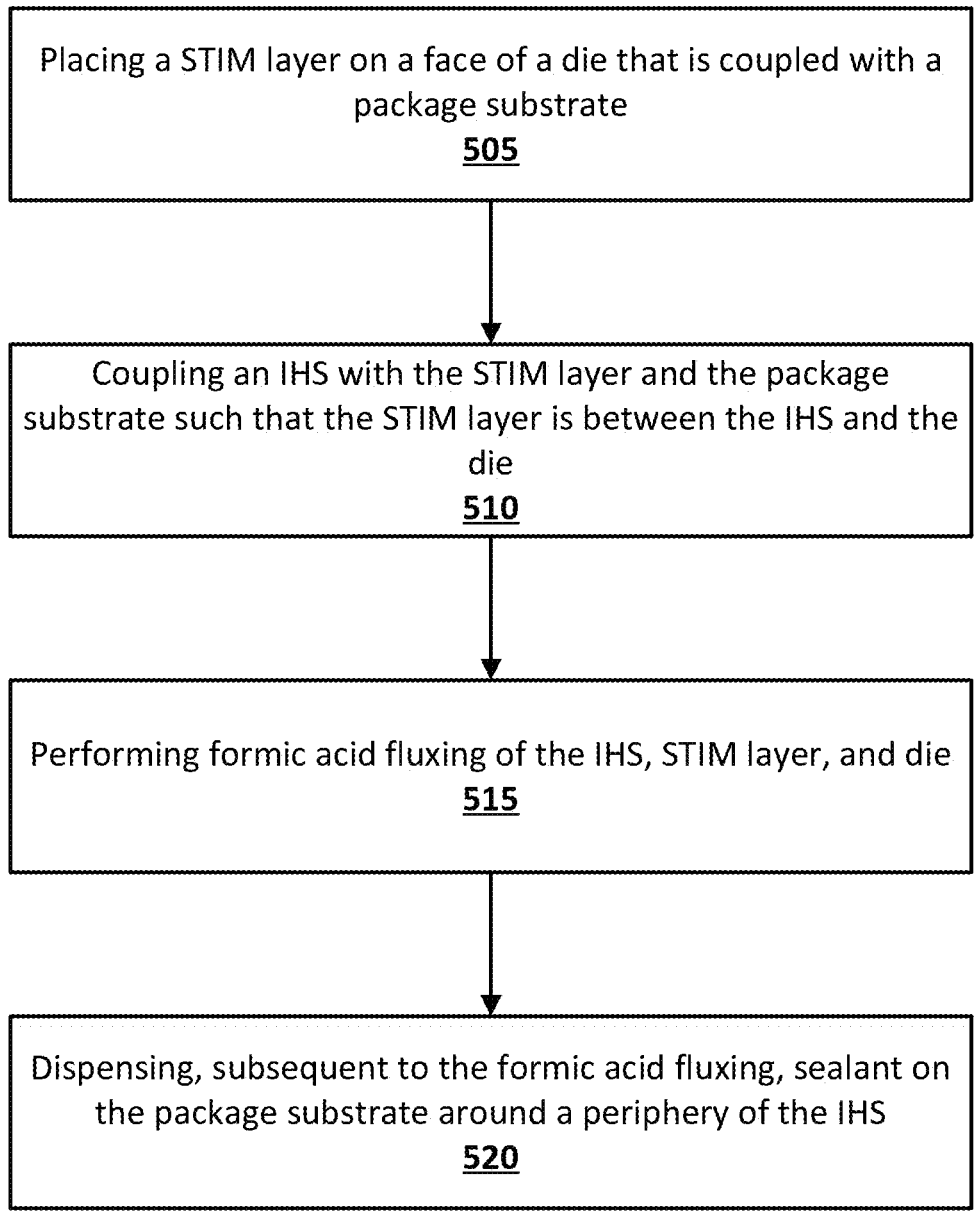
FIG. 5 depicts an alternative example technique for manufacturing a microelectronic package with an underfilled sealant, in accordance with various embodiments.

FIG. 5 depicts an alternative example technique for manufacturing a microelectronic package with an underfilled sealant, in accordance with various embodiments. Similarly to FIG. 4, FIG. 5 may be applicable to the manufacture of a microelectronic package wherein a formic acid soldering flux is used. Also, similarly to FIG. 4, FIG. 5 may be discussed with respect to the embodiment of FIG. 1, however it will be understood that FIG. 5 may be applicable, in whole or in part, with or without modification, to other embodiments of the present disclosure.

The technique may include placing, at 505, a STIM layer on a face of a die that is coupled with a package substrate. The die may be similar to, for example, die 105. The package substrate may be similar to, for example, package substrate 110. The STIM layer may be similar to, for example, STIM layer 150. The die may be coupled with the package substrate by interconnects such as interconnects 115. As described above, the STIM layer may be placed on the die through a technique such as pick-and-place or some other type of placement technique.

The technique may further include coupling, at 510, an IHS with the STIM layer and the package substrate such that the STIM layer is between the IHS and the die. The IHS may be similar to, for example, IHS 125. Coupling the IHS to the package substrate may include coupling the IHS by way of a conductive adhesive, a non-conductive adhesive, one or more interconnects such as a BGA, LGA, PGA, etc., a socket, etc. Coupling the IHS with the package substrate may further include coupling the IHS with the STIM layer as depicted in FIG. 1.

The technique may further include performing, at 515, formic acid solder fluxing of the IHS, STIM layer, and die. The formic acid solder fluxing may include, for example, placing the IHS, STIM layer, and die in a formic acid oven where a gas that includes formic acid is then injected. The formic acid may serve as a soldering flux to clean oxides from the surfaces of the IHS, the STIM layer, or the die, as described above.

The technique may further include dispensing, at 520, sealant on the package substrate around a periphery of the IHS. Specifically, the sealant may be dispensed on the package substrate subsequent to the formic acid solder fluxing. The sealant may be similar to, for example, sealant 130. Dispensation of sealant may include, for example, injection from a nozzle, a spray, or some other type of dispensation technique. As noted, the sealant may be dispensed around the periphery of the IHS, and then may flow between the IHS and the package substrate through a CUF-type action. Reflow and curing, for example as described above with respect to element 425, may then be performed.

Figure 6:
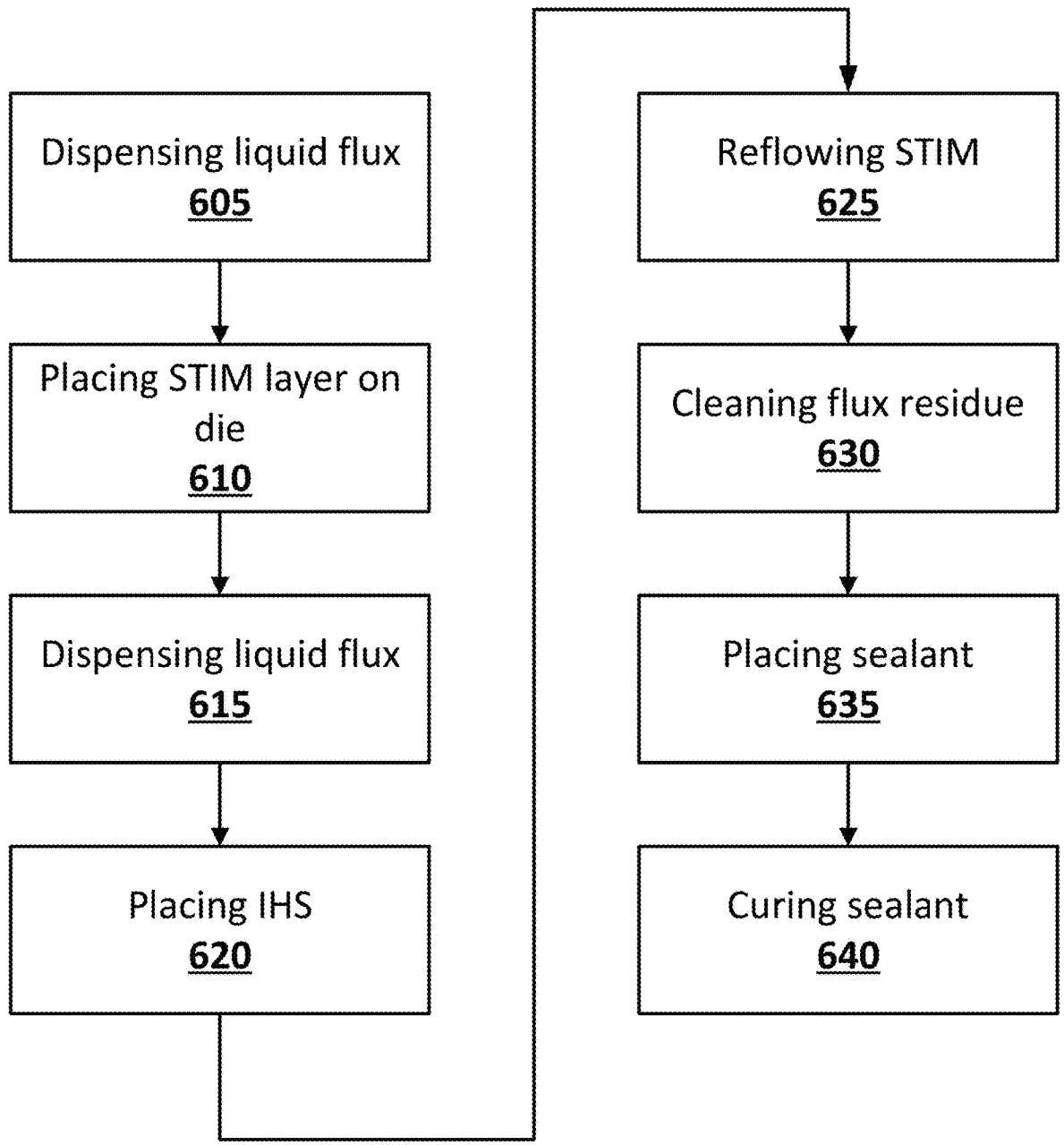
FIG. 6 depicts an alternative example technique for manufacturing a microelectronic package with an underfilled sealant, in accordance with various embodiments.

FIG. 6 depicts an alternative example technique for manufacturing a microelectronic package with an underfilled sealant, in accordance with various embodiments. Specifically, FIG. 6 depicts an example technique which may be used with a liquid soldering flux. Similarly to FIG. 4, FIG. 6 may be discussed with respect to the embodiment of FIG. 1, however it will be understood that FIG. 6 may be applicable, in whole or in part, with or without modification, to other embodiments of the present disclosure.

Generally, the technique may include dispensing, at 605, liquid soldering flux. Generally, the liquid soldering flux may include an acid, a resin, and a solvent. The flux may be dispensed through various techniques such as spray deposition, a nozzle such as a time-pressure or jet nozzle, lamination, or some other technique. The liquid flux may be placed on a face of a die such as die 105, and the flux may generally interact with the face of the die and remove oxides which may be present from the face of the die. As described above, the removal of the oxides may help enhance the adhesion of a STIM layer to the face of the die.

The technique may then include placing, at 610, a STIM layer on the die. The STIM layer may be similar to, for example, STIM layer 150. As noted above, the STIM layer may be placed on the die through various processes such as those described above with respect to element 405.

The technique may further include dispensing, at 615, liquid flux. The liquid flux may be similar to, for example, the liquid flux described above with respect to element 605. In some embodiments the flux may be the same as described above with respect to element 605, while in other embodiments the liquid flux may have a different formulation than that used above in element 605. The liquid flux may be dispensed, for example, on the face of an IHS such as IHS 125, or on the STIM layer, or both. Similarly to described above, the liquid flux may interact with the STIM layer or the IHS and remove oxides from the face of the STIM layer or the IHS. As described above, the removal of the oxides may help enhance adhesion of the STIM layer to the IHS.

The technique may then include placing, at 620, the IHS on the STIM layer. Placing the IHS may include, for example, placing the IHS on the STIM layer via a pick-and-place technique or some other technique.

The technique may further include reflowing, at 625, the STIM layer. Reflow of the STIM layer may include, for example, a thermal reflow (e.g., exposing the elements of the microelectronic package, and particularly the STIM layer, to heat), chemical reflow, or some other type of reflow process. The reflow may cause the STIM layer to at least partially soften or melt such that when it re-solidifies it is adhered to one or both of the die and the IHS.

The technique may further include cleaning, at 630, the flux residue. Removal of the flux residue may include washing the flux reside from the STIM layer with water or some other solvent material.

The technique may then include placing, at 635, sealant material around the periphery of the IHS. The sealant material may be similar to, for example, sealant 130. Placing the sealant material around the periphery of the IHS may be performed through an injected nozzle or some other technique.

Figure 7:
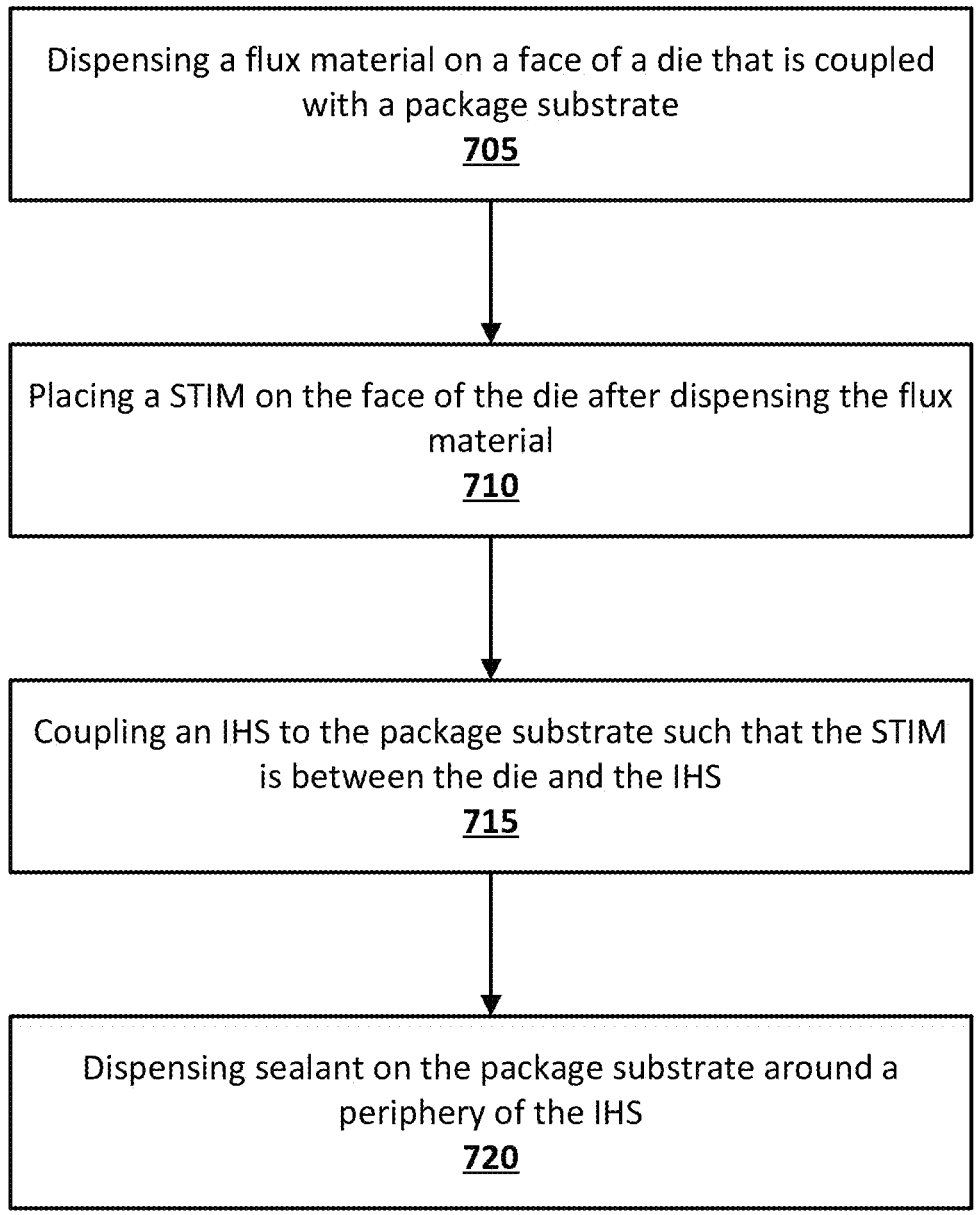
FIG. 7 depicts an alternative example technique for manufacturing a microelectronic package with an underfilled sealant, in accordance with various embodiments.

The technique may further include curing, at 640, the sealant. The sealant cure may include techniques similar to, for example, those of element 425 as described above FIG. 7 depicts an alternative example technique for manufacturing a microelectronic package with an underfilled sealant, in accordance with various embodiments. Similarly to FIG. 6, FIG. 7 depicts an example technique which may be used with a liquid flux. FIG. 7 may be discussed with respect to the embodiment of FIG. 1, however it will be understood that FIG. 7 may be applicable, in whole or in part, with or without modification, to other embodiments of the present disclosure.

The technique may include dispensing, at 705, a flux material on a face of a die that is coupled with a package substrate. The soldering flux material may be similar to, for example, the liquid soldering flux described above with respect to element 605, and may be dispensed in a manner similar to that described above. The die may be similar to, for example, die 105. The package substrate may be similar to, for example, package substrate 110.

The technique may further include placing, at 710, a STIM on the face of the die. The STIM may be similar to, for example, STIM layer 150. Generally, the STIM may be placed on the face of the die after the dispensing of the soldering flux material as described above. Because the soldering flux material may have removed oxide build-up from the face of the die, the STIM-die interface may be stronger than if the soldering flux material was not used.

The technique may further include coupling, at 715, an IHS to the package substrate such that the STIM is between the die and the IHS. The IHS may be similar to, for example, IHS 125 and may be coupled to the package substrate as described above. In some embodiments, the technique may further include performing additional solder fluxing on the STIM or the IHS as described above with respect to element 615.

Subsequent to the coupling of the IHS to the package at 715, the technique may include dispensing, at 720, sealant on the package substrate around a periphery of the IHS. The sealant may be similar to sealant 130, and the dispensation of the sealant may be similar to element 520 described above. Reflow and cure, for example as described above at 425, may then be performed.

It will be understood that the above-described techniques of FIGS. 4-7 are intended as example embodiments, and other embodiments may vary from those depicted above. For example, some techniques may have more or fewer elements than depicted above. Certain elements may be performed concurrently with one another, or in a different order than depicted in the various Figures. Certain of the techniques may include elements from others of the techniques. For example, FIGS. 4 and 5 may include elements of one another, FIGS. 6 and 7 may include elements of one another, or other Figures may include elements of one another. Other variations may be present in other embodiments.

Figure 8:
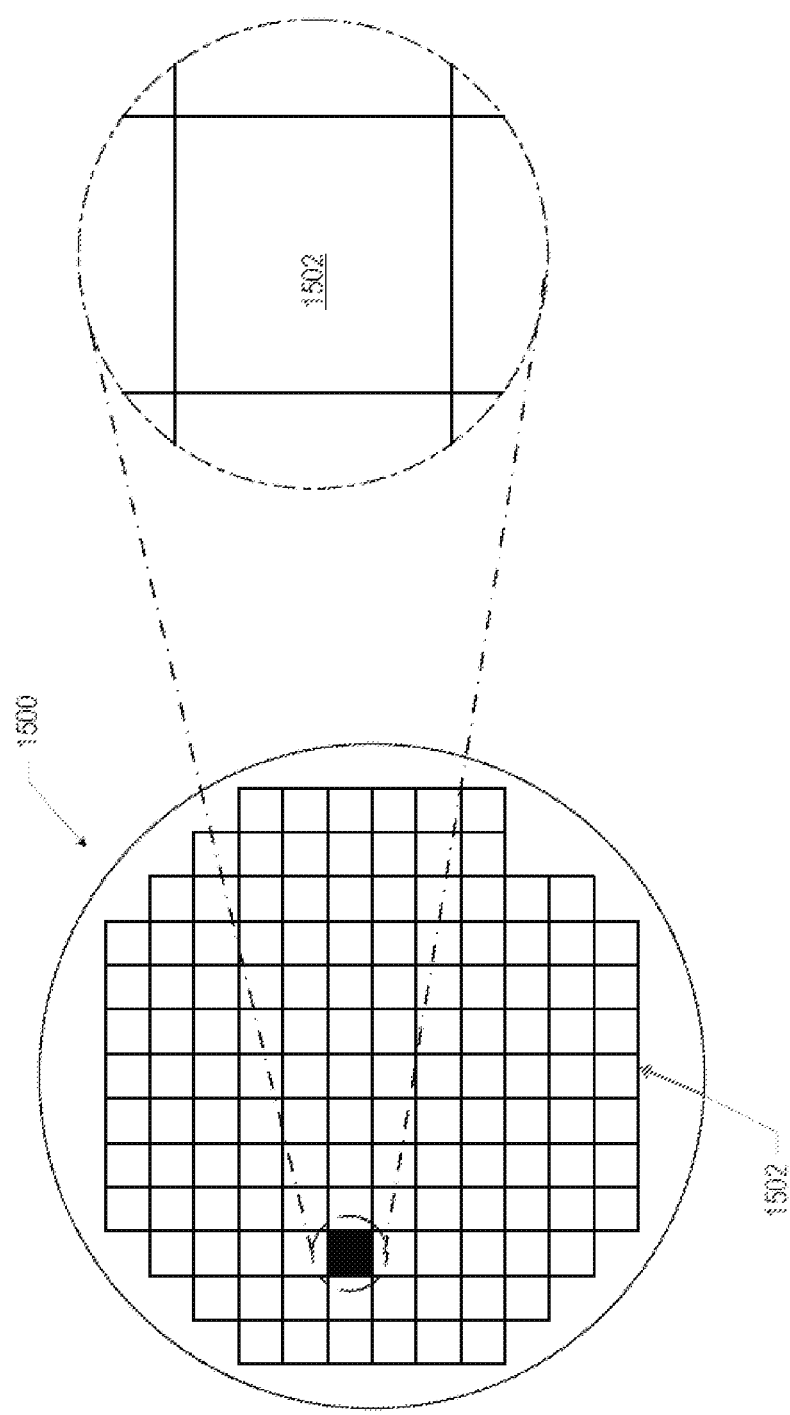
FIG. 8 is a top view of a wafer and dies that may include a microelectronic package with an underfilled sealant, in accordance with various embodiments.

FIG. 8 is a top view of a wafer 1500 and dies 1502. The dies 1502 may be similar to, for example, die 105 or some other die herein. The dies 1502 may be included in an IC package including an underfilled sealant in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 9:
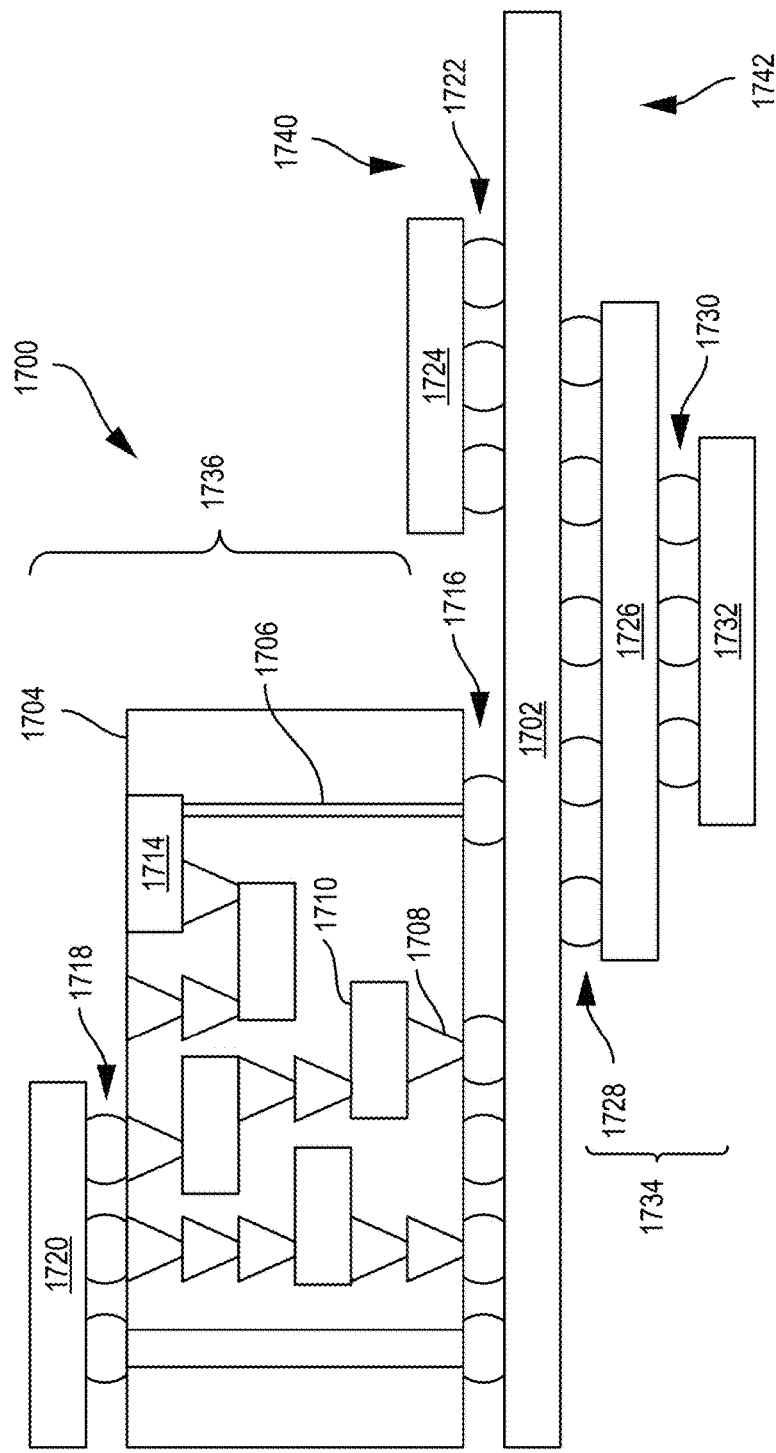
FIG. 9 is a side, cross-sectional view of an integrated circuit (IC) device assembly that may include a microelectronic package with an underfilled sealant, in accordance with various embodiments.

FIG. 9 is a side, cross-sectional view of an IC device assembly 1700 that may include one or more IC packages or other electronic components (e.g., a die) including an underfilled sealant, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The IC package 1720 may include an underfilled sealant as described above. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 8), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The IC package 1724 may include an underfilled sealant as described herein. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. In some embodiments, one or both of the IC package 1726 and the IC package 1732 may include an underfilled sealant as described above. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
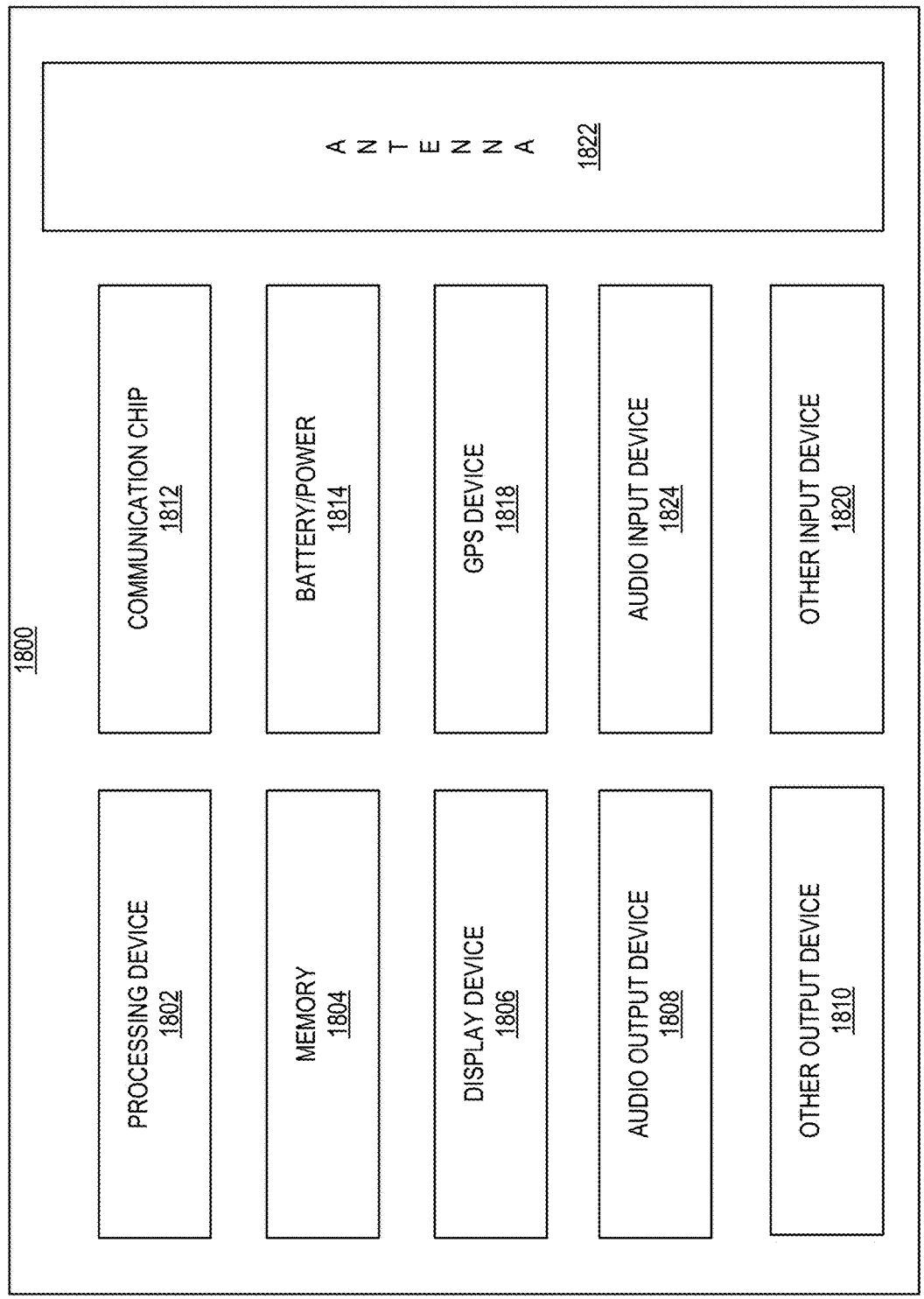
FIG. 10 is a block diagram of an example electrical device that may include a microelectronic package with an underfilled sealant, in accordance with various embodiments.

FIG. 10 is a block diagram of an example electrical device 1800 that may include an underfilled sealant, in accordance with any of the embodiments disclosed herein. For example, any suitable ones of the components of the electrical device 1800 may include one or more of the IC device assemblies 1700 or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, graphics processing units, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), non-volatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Various of the elements, e.g. the processing device 1802, the communication chip 1812, the memory 1804, etc. may be implemented as a die, which may be similar to die 105. Specifically, various of the elements of the electrical device 1800 may be elements of a microelectronic package, such as microelectronic package 100 or 200, which may include an underfilled sealant as described above.

EXAMPLES OF VARIOUS EMBODIMENTS

Example 1 includes a microelectronic package comprising: a package substrate; an IHS coupled with the package substrate; and a sealant positioned between, and physically coupled to, the IHS and the package substrate, wherein the sealant at least partially extends from a footprint of the IHS.

Example 2 includes the microelectronic package of example 1, wherein the microelectronic package further includes a die positioned between the package substrate and the IHS.

Example 3 includes the microelectronic package of example 2, wherein the microelectronic package further includes a STIM positioned between, and coupled to, the IHS and the die.

Example 4 includes the microelectronic package of example 3, wherein the STIM includes indium.

Example 5 includes the microelectronic package of any of examples 1-4, wherein the sealant has a modulus range between 3 and 50 megapascals (MPas).

Example 6 includes the microelectronic package of any of examples 1-4, wherein the sealant is an epoxy sealant or a silicon sealant.

Example 7 includes the microelectronic package of any of examples 1-4, wherein the sealant includes a silica, silicone, alumina, metal, or organic filler.

Example 8 includes the microelectronic package of any of examples 1-4, wherein the sealant includes silane, titanate, or zirconate.

Example 9 includes the microelectronic package of any of examples 1-4, wherein the IHS includes copper.

Example 10 includes the microelectronic package of any of examples 1-4, wherein the sealant extends away from the package substrate at least partially along a wall of the IHS.

Example 11 includes the microelectronic package of any of examples 1-4, wherein the sealant forms a fillet around a periphery of the IHS.

Example 12 includes the microelectronic package of any of examples 1-4, wherein the IHS includes a spacer that is positioned between a plate of the IHS and the package substrate, and wherein the sealant is positioned between, and physically coupled to, the spacer and the package substrate.

Example 13 includes a method of forming a microelectronic package with an IHS, wherein the method comprises: placing a STIM layer on a face of a die that is coupled with a package substrate; coupling an IHS with the STIM layer and the package substrate such that the STIM is between the IHS and the die; performing formic acid fluxing of the IHS, STIM layer, and die; and dispensing, subsequent to the formic acid fluxing, sealant on the package substrate around a periphery of the IHS.

Example 14 includes the method of example 13, wherein, when the sealant is dispensed on the package substrate, the sealant is to flow between the IHS and the package substrate through capillary underfill.

Example 15 includes the method of examples 13 or 14, wherein the sealant has a modulus range between 3 and 50 megapascals (MPas).

Example 16 includes the method of examples 13 or 14, wherein the STIM layer includes indium.

Example 17 includes a method of forming a microelectronic package with an IHS, wherein the method comprises: dispensing a flux material on a face of a die that is coupled with a package substrate; dispensing a STIM layer on the face of the die after dispensation of the flux material; coupling an IHS to the package substrate such that the STIM layer is between the die and the IHS; and dispensing sealant on the package substrate around a periphery of the IHS.

Example 18 includes the method of example 17, wherein the flux material is a soldering flux.

Example 19 includes the method of examples 17 or 18, further comprising dispensing, prior to the coupling of the IHS, the flux material on the STIM layer.

Example 20 includes the method of examples 17 or 18, wherein the sealant is an epoxy sealant or a silicon sealant.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A method of forming a microelectronic package with an integrated heat spreader (IHS), the method comprising:
   placing a solder thermal interface material (STIM) layer on a face of a die that is coupled with a package substrate;
   coupling the IHS with the STIM layer and the package substrate such that the STIM is between the IHS and the die;
   performing formic acid fluxing of the IHS, STIM layer, and die; and
   dispensing, subsequent to performing formic acid fluxing of the IHS, a sealant on the package substrate around a periphery of the IHS.

2. The method of claim 1, wherein, when the sealant is dispensed on the package substrate, the sealant is to flow between the IHS and the package substrate through capillary underfill.

3. The method of claim 1, wherein the sealant has a modulus range between 3 and 50 megapascals (MPas).

4. The method of claim 1, wherein the STIM layer includes indium.

5. The method of claim 1, wherein the sealant is an epoxy sealant or a silicon sealant.

6. The method of claim 1, wherein the sealant includes a silica, silicone, alumina, metal, or organic filler.

7. The method of claim 1, wherein the sealant includes silane, titanate, or zirconate.

8. A method of forming a microelectronic package with an integrated heat spreader (IHS), the method comprising:
dispensing a flux material on a face of a die that is coupled with a package substrate;
dispensing a solder thermal interface material (STIM) layer on the face of the die after dispensation of the flux material;
coupling the IHS to the package substrate such that the STIM layer is between the die and the IHS; and
dispensing a sealant on the package substrate around a periphery of the IHS.

9. The method of claim 8, wherein the flux material is a soldering flux.

10. The method of claim 8, further comprising dispensing, prior to the coupling of the IHS, the flux material on the STIM layer.

11. The method of claim 8, wherein the sealant is an epoxy sealant or a silicon sealant.

12. The method of claim 8, wherein the sealant includes a silica, silicone, alumina, metal, or organic filler.

13. The method of claim 8, wherein the sealant includes silane, titanate, or zirconate.

14. A method of forming a microelectronic package with an integrated heat spreader (IHS), the method comprising:
performing formic acid fluxing of the IHS, a solder thermal interface material (STIM) layer on a face of a die, and the die, wherein the die is coupled with a package substrate, and the IHS is coupled with the STIM layer and the package substrate such that the STIM is between the IHS and the die; and
dispensing, subsequent to performing formic acid fluxing of the IHS, a sealant on the package substrate around a periphery of the IHS.

15. The method of claim 14, wherein, when the sealant is dispensed on the package substrate, the sealant is to flow between the IHS and the package substrate through capillary underfill.

16. The method of claim 14, wherein the sealant has a modulus range between 3 and 50 megapascals (MPas).

17. The method of claim 14, wherein the STIM layer includes indium.

18. The method of claim 14, wherein the sealant is an epoxy sealant or a silicon sealant.

19. The method of claim 14, wherein the sealant includes a silica, silicone, alumina, metal, or organic filler.

20. The method of claim 14, wherein the sealant includes silane, titanate, or zirconate.

* * * * *